United States Patent
Lee et al.

(10) Patent No.: US 8,760,598 B2
(45) Date of Patent: Jun. 24, 2014

(54) THIN FILM TRANSISTOR ARRAY PANEL, LIQUID CRYSTAL DISPLAY, METHOD FOR REPAIRING THE SAME, COLOR FILTER ARRAY PANEL AND METHOD FOR MANUFACTURING THE SAME

(71) Applicant: Samsung Display Co., Ltd., Yongin (KR)

(72) Inventors: Jong-Hyuk Lee, Seongnam-si (KR); Bon-Yong Koo, Asan-si (KR); Sun-Mi Kim, Seongnam-si (KR); Ju Hyeon Baek, Asan-si (KR); Ji Young Jeong, Cheonan-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/946,674

(22) Filed: Jul. 19, 2013

(65) Prior Publication Data

US 2013/0302915 A1 Nov. 14, 2013

Related U.S. Application Data

(62) Division of application No. 13/159,818, filed on Jun. 14, 2011, now Pat. No. 8,493,525.

(30) Foreign Application Priority Data

Oct. 28, 2010 (KR) .................. 10-2010-0106266
Nov. 24, 2010 (KR) .................. 10-2010-0117471

(51) Int. Cl.
*G02F 1/1343* (2006.01)
*G02F 1/1333* (2006.01)
*G02F 1/13* (2006.01)

(52) U.S. Cl.
USPC ................ 349/55; 349/54; 349/192

(58) Field of Classification Search
USPC .............................. 349/54–55, 192
See application file for complete search history.

(56) References Cited

U.S. PATENT DOCUMENTS 7,053,977 B2   5/2006   Chang
7,193,664 B2   3/2007   Liu et al.
(Continued)

FOREIGN PATENT DOCUMENTS

| JP | 09230385 | 5/1997 |
| JP | 11260819 | 9/1999 |
| JP | 2005092154 | 4/2005 |

(Continued)

OTHER PUBLICATIONS

Notice of Allowance in U.S. Appl. No. 13/159,818 dated Mar. 25, 2013.

*Primary Examiner* — Phu Vu
(74) *Attorney, Agent, or Firm* — H.C. Park & Associates, PLC

(57) ABSTRACT

A thin film transistor array panel includes: a substrate; a gate line and a storage electrode that are disposed on the substrate; a data line that crosses the gate line and storage electrode line; a thin film transistor that is connected with the gate line and data line; and a pixel electrode that is connected to the thin film transistor. The storage electrode includes a first storage electrode that is parallel to the gate line, second storage electrodes that extend on opposing sides of the data line from the first storage electrode, a connection part that crosses the data line and connects pairs of the second storage electrodes, and a connection bridge that crosses the gate line and connects a second storage electrode to a second storage electrode of an adjacent pixel.

16 Claims, 16 Drawing Sheets

(56) References Cited

U.S. PATENT DOCUMENTS

| | | |
|---|---|---|
| 7,283,183 B2 | 10/2007 | Liu et al. |
| 7,649,580 B2 | 1/2010 | Su |
| 2009/0284680 A1 | 11/2009 | Peng |
| 2009/0322977 A1 | 12/2009 | Chung et al. |

FOREIGN PATENT DOCUMENTS

| | | |
|---|---|---|
| JP | 2005215455 | 8/2005 |
| JP | 2007334293 | 12/2007 |
| JP | 2009092850 | 4/2009 |
| JP | 2010049284 | 3/2010 |
| JP | 2010072216 | 4/2010 |
| KR | 1020040039986 | 5/2004 |
| KR | 1020060030632 | 4/2006 |
| KR | 1020070059698 | 6/2007 |
| KR | 1020070117738 | 12/2007 |
| KR | 1020080000751 | 1/2008 |
| KR | 1020090094427 | 9/2009 |
| KR | 100921451 | 10/2009 |
| KR | 100923701 | 10/2009 |

THIN FILM TRANSISTOR ARRAY PANEL, LIQUID CRYSTAL DISPLAY, METHOD FOR REPAIRING THE SAME, COLOR FILTER ARRAY PANEL AND METHOD FOR MANUFACTURING THE SAME

CROSS-REFERENCE TO RELATED APPLICATION

This application is a divisional of U.S. patent application Ser. No. 13/159,818, filed on Jun. 14, 2011, and claims priority to and the benefit of Korean Patent Application Nos. 10-2010-0106266 and 10-2010-0117471 filed on Oct. 28, 2010 and Nov. 24, 2010, respectively, which are hereby incorporated by reference for all purposes as if fully set forth herein.

BACKGROUND OF THE INVENTION

1. Field of the Invention

Aspects of the present invention relate to a thin film transistor array panel, a liquid crystal display, a method for repairing the same, a color filter array panel, and a method for manufacturing the same.

2. Description of the Related Art

A liquid crystal display (LCD) is currently one of the most widely used types of flat panel display. An LCD includes two substrates on which electrodes are formed and a liquid crystal layer that is disposed there between. An LCD controls the intensity of transmitted light by rearranging the liquid crystal molecules, by applying a data signal to the electrodes.

A thin film transistor (TFT) substrate that is one of two substrates constituting the liquid crystal display is used as a circuit board for independently driving each pixel in a liquid crystal display, an organic light emitting diode (OLED) display, and the like.

In the thin film transistor substrate, a gate line that transmits a gate signal and a data line that transmits a data signal cross each other. A thin film transistor is connected to the gate line and data line, and a pixel electrode is connected to thin film transistor.

When a wire of the liquid crystal display is disconnected or short-circuited, a corresponding pixel becomes a defective pixel. Thus, it is often necessary to perform a repair process. There is a problem in that the repaired pixel and the adjacent pixels have a lower or higher luminance, as compared to a normal pixel.

The above information disclosed in this Background section is only for enhancement of understanding of the background of the invention and therefore it may contain information that does not constitute prior art.

SUMMARY OF THE INVENTION

In order to repair a defective pixel, and particularly, when defects occur in the pixel because of the disconnection of a data line, laser cutting and laser short-circuiting processes are performed in order to repair the data line. As the number of laser processes is increased, repair times are also increased.

In addition, the laser process produces impurities. Since the impurities are conductive particle, a common electrode and a pixel electrode or a common electrode and a data line may be short-circuited. As a result, image quality may be reduced.

Exemplary embodiments of the present invention provide a thin film transistor array panel and a liquid crystal display and a method for repairing the same, in which short-circuiting due to laser-generated impurity is reduced.

An exemplary embodiment of the present invention provides a thin film transistor array panel including: an substrate; gate lines and storage electrode lines that are disposed on the substrate; data lines that cross the gate lines and storage electrode lines; thin film transistors that are connected to the gate lines and data lines; and pixel electrodes that are connected to the thin film transistors. The storage electrode lines include first storage electrodes that are parallel to the gate lines, second storage electrodes that extend along opposing sides of the data lines, connection parts that cross the data lines and connect the second storage electrodes, and connection bridges cross the gate lines and connect the second storage electrodes.

Yet another exemplary embodiment of the present invention provides a method for repairing the thin film transistor array panel, wherein the connection part includes a first connection part and a second connection part that are adjacent to two adjacent gate lines, the method including: cutting a portion between the left second storage electrode and first connection part, a portion between the left second storage electrode and second connection part, and a portion between the connection bridge and second bent part using a laser, and short-circuiting the data line to the first connection part using the laser.

Still another exemplary embodiment of the present invention provides a liquid crystal display including: a first substrate; a plurality of color filters that are disposed on the first substrate; a common electrode that is disposed on the color filter; a second substrate that faces the first substrate; a gate line and a storage electrode line that are disposed on the second substrate; a data line that crosses the gate line; a thin film transistor that is connected to the gate line and data line; and a pixel electrode that is connected to the thin film transistor. The color filter has a recess that exposes an intersection of the storage electrode line and data line cross.

Another exemplary embodiment of the present invention provides a method for manufacturing a color filter, the method including: forming a first photosensitive film that includes a first pigment on an substrate that includes pixel areas disposed in rows and columns; forming a first color filter by exposing and developing the first photosensitive film using a photomask; forming a second photosensitive film that includes a second pigment on the substrate; and forming a second color filter by exposing and developing the second photosensitive film through the photomask, after moving the photomask by two columns. The photomask includes a first opening, a second opening, and projections that extend into the openings.

According to exemplary embodiments of the present invention, the connection part allows for a reduction in a number of repair operations.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
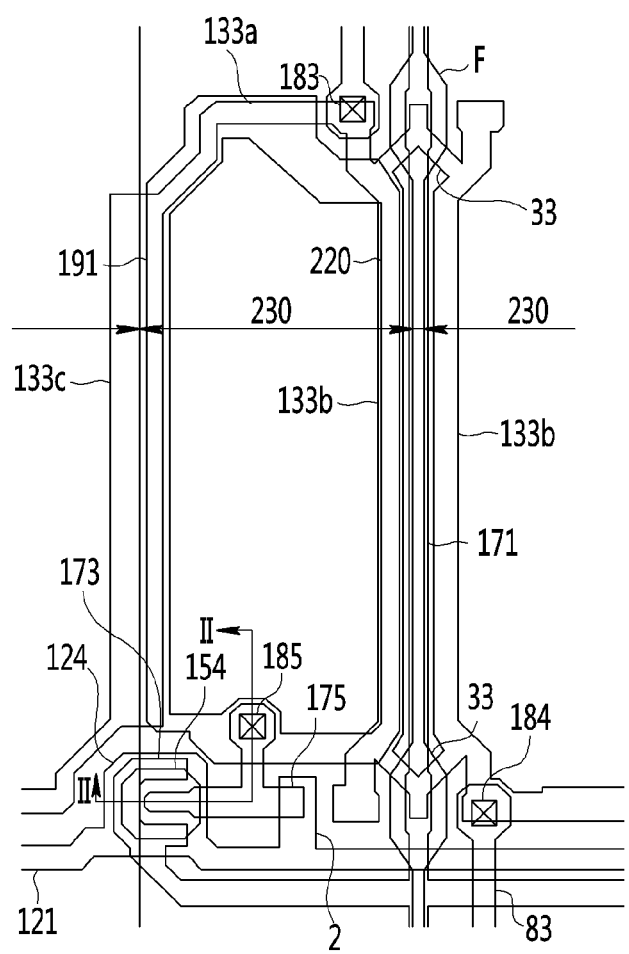
FIG. 1 is a layout view illustrating one pixel of a liquid crystal display, according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
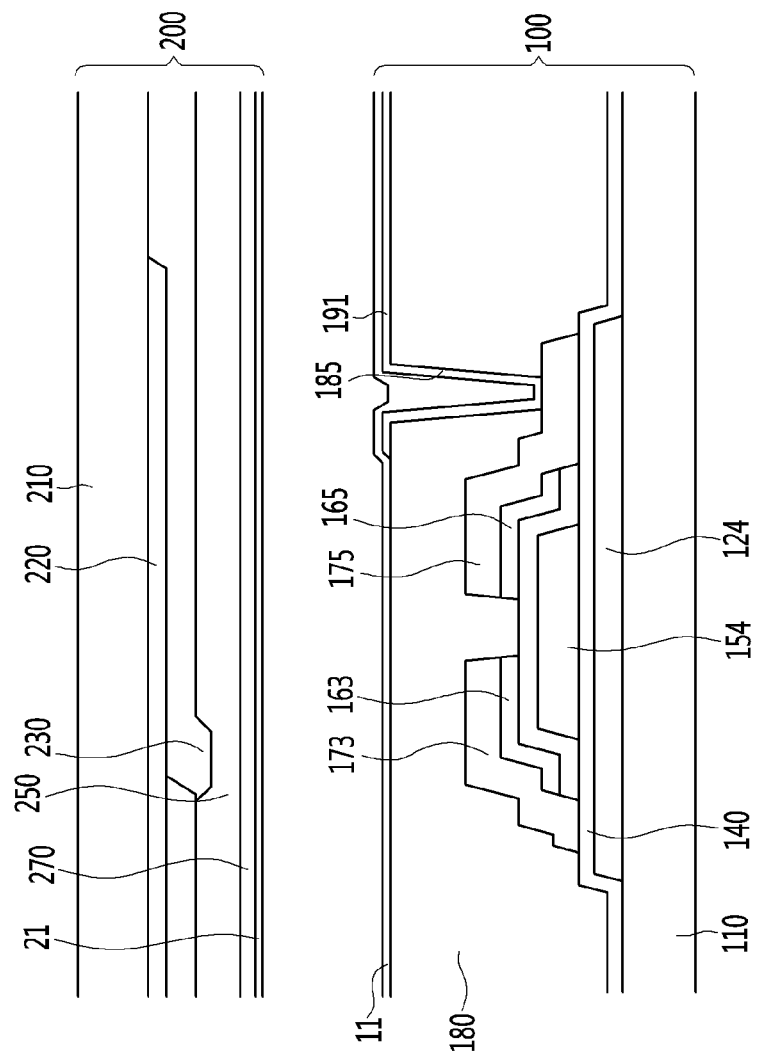
FIG. 2 is a cross-sectional view that is taken along the line II-II of FIG. 1.
Figure 3:
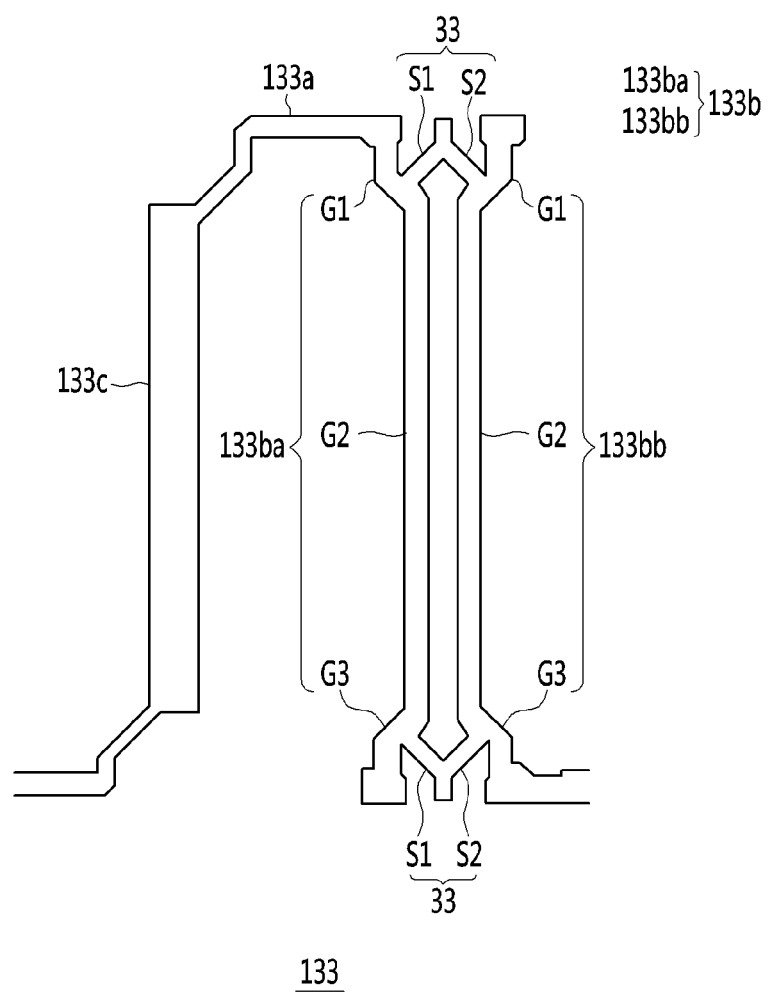
FIG. 3 is a layout view that illustrates only a storage electrode in the pixel of FIG. 1.

FIG. 1 is a layout view illustrating one pixel of a liquid crystal display, according to an exemplary embodiment of the present invention, FIG. 2 is a cross-sectional view that is taken along line II-II of FIG. 1, and FIG. 3 is a layout view that illustrates storage electrodes in the pixel of FIG. 1. Referring to FIG. 1 and FIG. 2, the liquid crystal display includes a thin film transistor array panel 100, an opposing common electrode panel 200, and a liquid crystal layer (not shown) interposed there between.

The thin film transistor array panel 100 includes a transparent insulating substrate 110. The thin film transistor array panel 100 includes a gate line 121 and a storage electrode line 133 formed on the substrate 110.

The gate line 121 transfers a gate signal and extends in a generally horizontal direction. A gate electrode 124 protrudes from the gate line 121. A protrusion 2 also from the gate line 121. The protrusion 2 may form a storage capacitance by overlapping a drain electrode that will be described later.

Referring to FIGS. 1 and 3, the storage electrode line 133 includes a first storage electrode 133a, a second storage electrode 133b, a third storage electrode 133c, and a pair of connection parts 33. The first storage electrode 133a extends in the same direction as the gate line 121. The first storage electrode 133a is connected to the second storage electrode 133b and the third storage electrode 133c.

The second storage electrode 133b includes a left second storage electrode 133ba and a right second storage electrode 133bb that are separated from each other and are connected by connection parts 33. The electrodes 133ba and 133bb are inversely symmetrical to each other and each have an end that is connected to the first storage electrode 133a and an end that is not connected to the first storage electrode 133a. For convenience of description, the ends that are connected to the first storage electrode 133a are referred to as a fixed end, and the ends that are not connected are referred to as a free end of the second storage electrode 133b.

The left second storage electrode 133ba and right second storage electrode 133bb each include a first bent part G1, a linear part G2, and a second bent part G3. The connection parts 33 include first oblique parts S1 that extend toward the data line 171 from the first bent parts G1 and the second bent part G3 of the left second storage electrode 133ba, and second oblique parts S2 that extend toward the data line 171 from the first bent part G1 and the second bent part G2 of the right second storage electrode 133bb.

The first oblique parts S1 and second oblique parts S2 are angled with respect to the data line 171. The connection parts 33 may be generally V-shaped or Y-shaped.

Referring again to FIG. 1 and FIG. 2, a gate insulating layer 140 is formed on the gate conductor. On the gate insulating layer 140, semiconductors 154 that overlap the gate electrode 124 are formed. The semiconductors 154 may be formed of amorphous silicon, crystalline silicon, or the like, and may be in the form of U-shaped strips.

A pair of ohmic contacts 163 and 165 is disposed on each semiconductor 154. The ohmic contacts 163a and 165a may made of a material such as a silicide or an n+ hydrogenated amorphous silicon, which is a type of silicon that is doped with a high concentration of an n-type impurity, such as phosphorus.

On the ohmic contacts 163 and 165 and the gate insulating layer 140, data lines 171, and drain electrodes 175 are formed. The data lines 171 transfer a data signal and mainly extend in a vertical direction, across the gate lines 121. Each data line 171 includes a source electrode 173 extending toward one of the gate electrodes 124.

The drain electrodes 175 extend in a horizontal direction. Each drain electrode 175 includes a rod part that faces one of the source electrodes 173, and an extension part that protrudes from the rod part. The source electrodes 173 are generally U-shaped and each surrounds an end of the rod part of a corresponding drain electrode 175.

The gate electrodes 124, semiconductors 154, source electrodes 173, and drain electrodes 175 form thin film transistors. Each semiconductor 154 includes a channel formed between the corresponding source electrode 173 and drain electrode 175. Although not shown in the drawing, a semiconductor strip that is disposed along the data line 171 may be formed while forming the thin film transistors.

A passivation layer 180 that is made of an organic insulator is formed on the thin film transistors. A first contact hole 185 that exposes the extension part of the drain electrode 175 is formed in the passivation layer 180. A second contact hole 183 and a third contact hole 184 that expose the fixed end and free end of the second storage electrode 133b are also formed in the passivation layer 180.

Pixel electrodes 191 and connection bridges 83 are formed on the passivation layer 180. Each connection bridge 83 may be made of a transparent conductive material, such as ITO (indium tin oxide) or IZO (indium zinc oxide), or a reflective metal, such as aluminum, silver, chromium, or an alloy thereof. The pixel electrode 191 is connected to the drain electrode 175 through the first contact hole 185 and receives a data signal from the drain electrode 175. The pixel electrode 191 is substantially rectangular and may overlap the second storage electrode 133b and the third storage electrode 133c.

The connection bridge 83 crosses the gate line 121, and connects the second storage electrodes 133b of two pixel areas that are disposed on opposing sides of the gate line 121, through the second contact hole 183 and the third contact hole 184. An alignment layer 11 is formed on the pixel electrode 191. The alignment layer 11 may be a horizontal alignment layer.

The common electrode panel 200 includes a light blocking member 220 formed on a transparent insulating substrate 210. The light blocking member 220 prevents light leakage and covers upper surfaces of the gate line 121, data line 171, thin film transistor Q, and storage electrodes 133a, 133b, and 133c.

On the light blocking member 220, a color filter 230 is formed. The color filter 230 forms the colors of the liquid crystal display. For example, the color filter 230 may have areas that form red, green, or blue primary colors, and the areas may be sequentially disposed. The color filter 230 may be longitudinally formed along the data lines 171.

Figure 4:
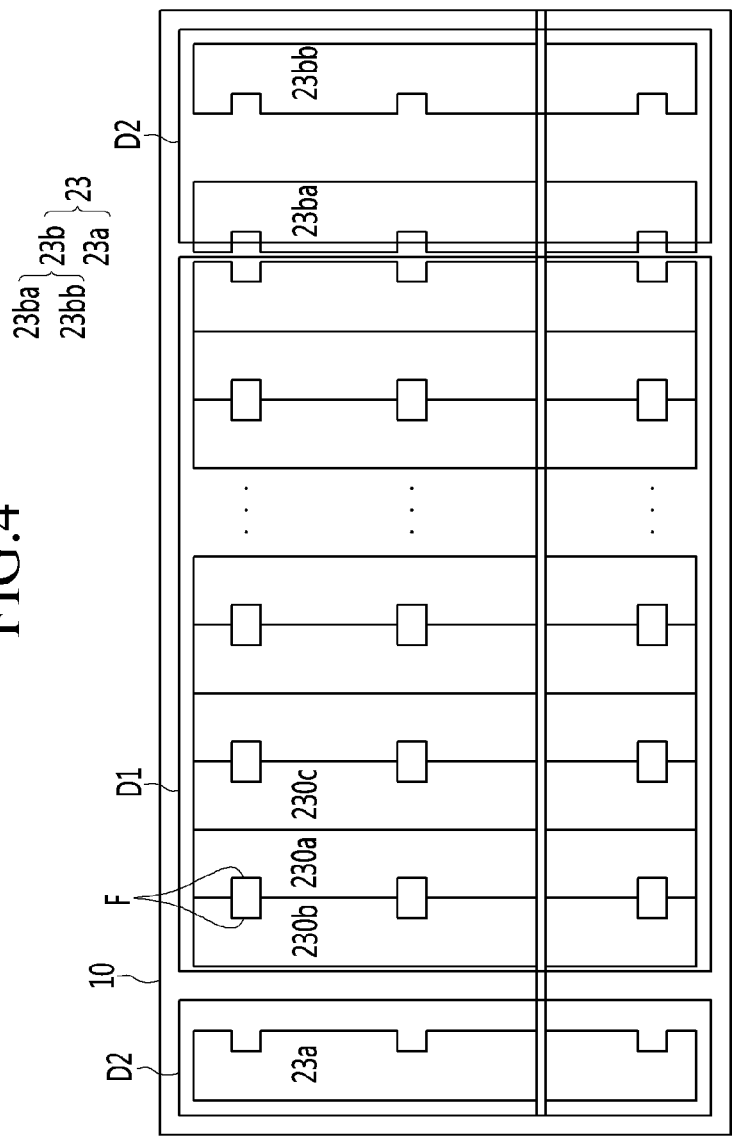
FIG. 4 is a layout view illustrating the arrangement of a color filter, according to an exemplary embodiment of the present invention.

FIG. 4 is a layout view of the arrangement of a color filter 230 in a liquid crystal display 10, according to an exemplary embodiment of the present invention. Referring to FIG. 1 and FIG. 4, the color filter 230 includes concave recesses F that are generally not disposed directly above the corresponding pixel areas.

The recesses F expose the intersections of the data lines 171 and connection parts 33. In this case, the recesses F of two adjacent portions of the color filters 230 face each other. The intersection of the data line 171 and connection part 33 is exposed through an opening formed by two adjacent recesses F.

As shown in FIG. 4, the liquid crystal display 10 includes a display unit D1 and a driving unit D2. The display unit D1 includes pixel areas. The driving unit D2 includes driving circuits for controlling the thin film transistors of the display unit D1. A dummy color filter 23 is formed on the driving unit D2.

The dummy color filter 23 includes a first dummy color filter 23a and a second dummy color filter 23b. The first dummy color filter 23a and the second dummy color filter 23b are disposed on the driving unit D2, outside the display unit D1. In this case, the first dummy color filter 23a and second dummy color filter 23b are disposed on opposing sides of the display unit D1.

The driving unit D2 is shown as being disposed on opposing sides of the display unit D1. However, according to some embodiments, the driving units D2 may be disposed at only one side of the display unit D1. Accordingly, the driving unit D2 may be disposed under only one of the first dummy color filter 23a and the second dummy color filter 23b.

The color filter 230 includes first color filters 230a, second color filters 230b, and third color filters 230c that produce corresponding colors. For example, the first color filters 230a may be green color filters, the second color filters 230b may be red color filters, and the third color filters 230c may be blue color filters. However, the present invention is not limited to any particular colors.

The first dummy color filter 23a may have the same color as the first color filters 230a. In addition, the second dummy color filter 23b may include a first small dummy color filter 23ba and a second small dummy color filter 23bb. The first small dummy color filter 23ba and the second small dummy color filter 23bb may have the same color as the second color filters 230b and the third color filters 230c, respectively. The first dummy color filter 23a may have the same width as the first color filter 230a, the first small dummy color filter 23ba may have the same width as the second color filter 230b, and the second small dummy color filter 23bb may have the same width as the third color filter 230c.

In this case, the first small dummy color filter 23ba and second small dummy color filter 23bb are separated from each other by the width of the first color filter 230a, and the first dummy color filter 23a is separated from the display unit D1 by the width of the second color filter 230b or third color filter 230c.

The edges of the color filters 230a, 230b, 230c of two adjacent pixels, as shown in FIG. 2, may overlap each other. However, the edges in which the recesses F are formed may not overlap.

A common electrode 270 is formed on the color filter 230. The common electrode 270 may be formed of the same transparent conductive material as the pixel electrode 191. If a predetermined voltage is applied to the common electrode 270, an electric field is generated in the liquid crystal layer, according to the voltage that is applied to the pixel electrode 191. The alignment of the liquid crystal molecules controls the light transmission thereof, such that an image may be formed. An alignment layer 21 is formed on the common electrode 270, and the alignment layer 21 may be a horizontal alignment layer.

Figure 5:
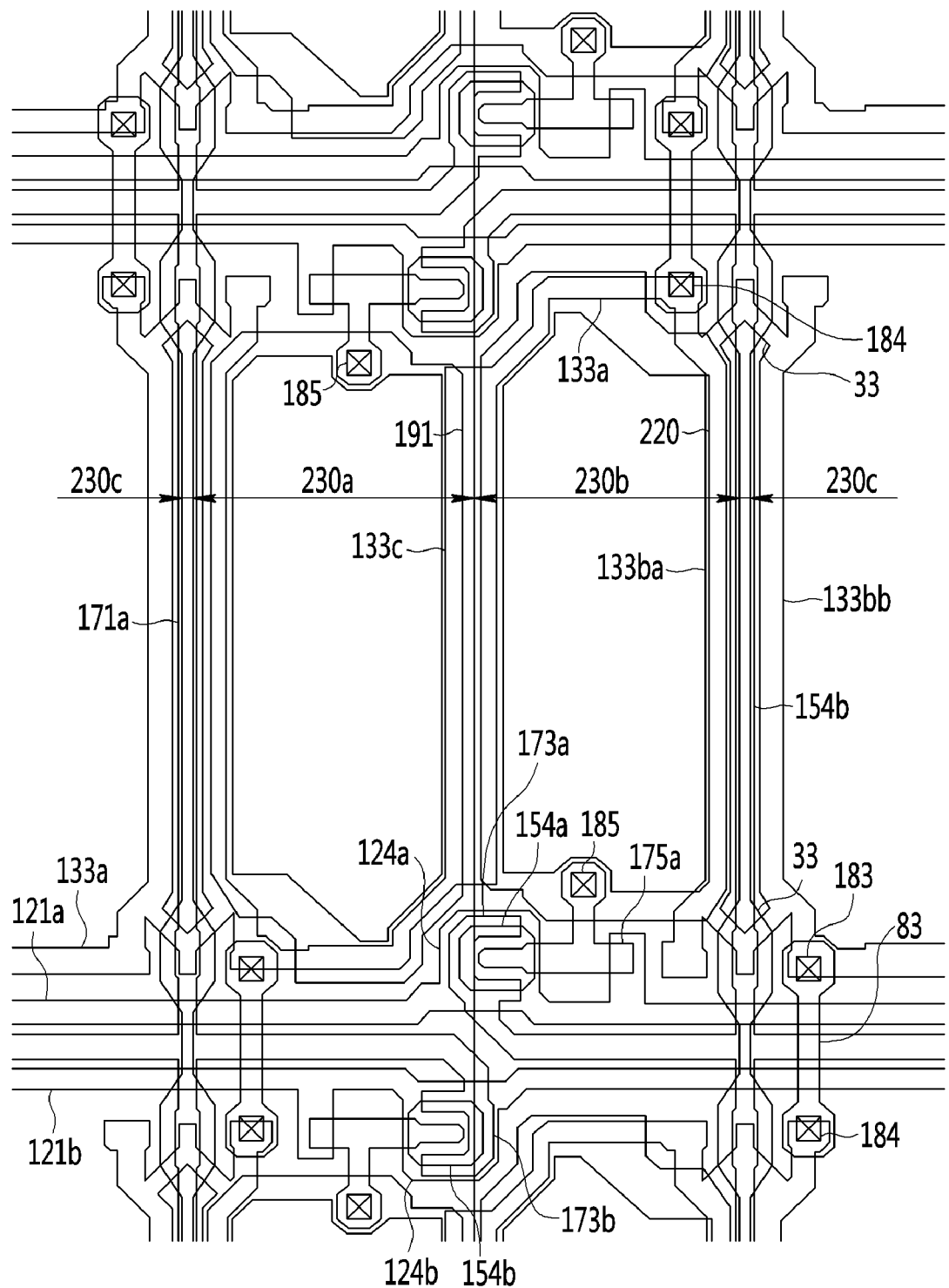
FIG. 5 and FIG. 6 are layout views of the thin film transistor array panel, according to an exemplary embodiment of the present invention, which includes the pixel of FIG. 1.
Figure 6:
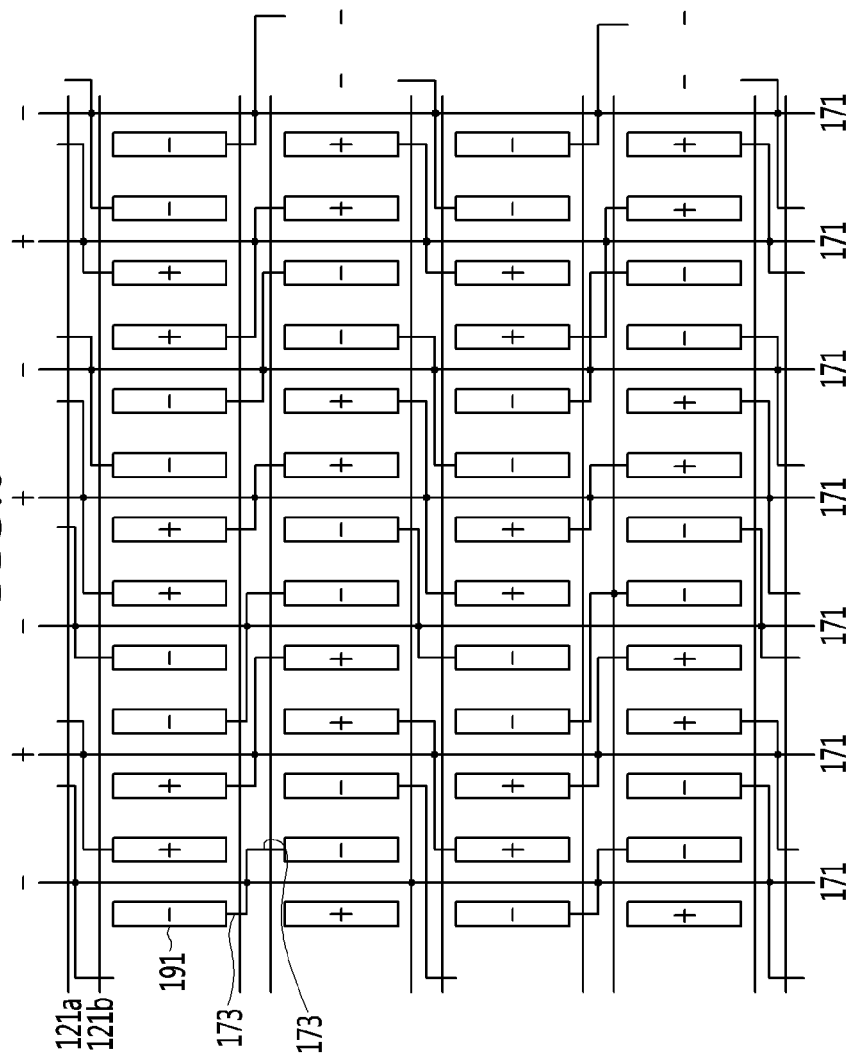

The thin film transistor array panel may transmit data signals to two pixels by using one data line, in order to reduce the number of data lines. FIG. 5 and FIG. 6 are layout views of the thin film transistor array panel according to an exemplary embodiment of the present invention, which includes the pixel of FIG. 1.

As shown in FIG. 5, a first gate line 121a that has a protruding first gate electrode 124a, and a second gate line 121b that has a protruding second gate electrode 124b are formed. The first gate electrode 124a and second gate electrode 124b are disposed on an extension line of a third storage electrode 133c.

One data line 171a is formed for each two pixel areas, in order to reduce the number of data lines. In other words, the data lines 171a are disposed between every other column of pixel areas. First and second source electrodes 173a and 173b extend perpendicularly to the data line 171a. Connection parts 33 connect left and right second storage electrode 133ba and 133bb, while crossing the data lines 171a. In other words, the connection parts 33 connect the storage electrodes of pixel areas in adjacent rows.

Third storage electrodes 133c are disposed equidistantly between each two adjacent data lines 171, and overlap edges of each two adjacent pixel electrodes 191. The first storage electrodes 133a are alternately connected to the fixed ends of the left second storage electrodes 133ba and the fixed ends of the right second storage electrodes 133bb, in adjacent columns. Therefore, the storage electrodes 133a, 133b, and 133c may form an approximately spherical wave.

The storage electrodes of adjacent pixels in different columns are electrically connected by the connection parts 33.

The storage electrodes of adjacent rows are connected by the connection bridges 83. Accordingly, the storage electrode line 133 maintains a uniform storage voltage.

As shown in FIG. 6, the connection of the pixel electrode and data line allow for 2 dot inversion driving. That is, pixels that are disposed between two adjacent data lines 171 have the same polarity, pixels on opposing sides of a data line 191 have opposite polarities, and pixels on opposing sides of first and second gate lines 121a and 121b have opposite polarities.

Although not shown in the drawing, since the thin film transistors extend to opposing sides of the data lines 171, the correlation between the pixel electrodes 191 and data lines 171 can be confirmed through the source electrodes 173. The pixel electrodes 191 receive a gate signal from the first or second gate lines 121a or 121b that overlap the corresponding source electrode 173. The plane pattern or connection relationship of the pixel electrodes 191 and thin film transistors of two pixels disposed on opposing sides of a data line 171 may be inversely symmetric or symmetric during an image phase, based on the data line.

Figure 7:
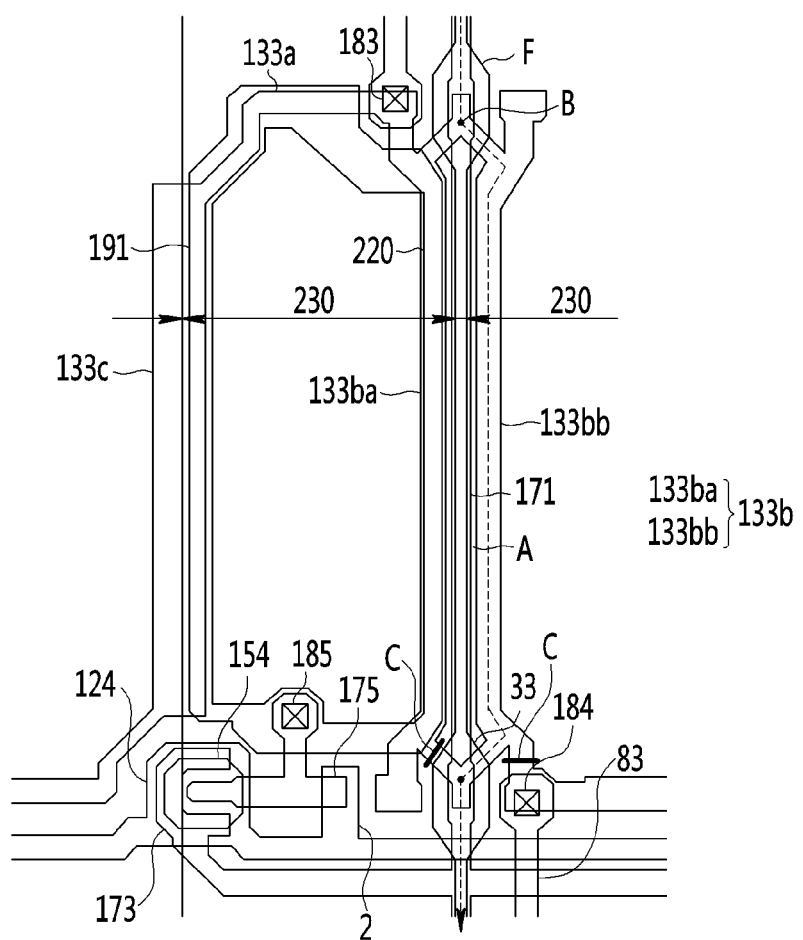
FIG. 7 is a layout view that illustrates a method for repairing a disconnected data line.

FIG. 7 is a layout view that illustrates a method for repairing a disconnected data line of a pixel. Since the pixel is similar to the pixel shown in FIG. 1, the detailed description thereof is omitted. As shown in FIG. 7, a portion A of the data line 171 is disconnected.

Since the data line 171 is disconnected, a portion B, in which the data line 171 and connection part 33 overlap, is short-circuited using a laser. In addition, the left second storage electrode 133ba or right second storage electrode 133bb that is connected to the connection part 33 is severed by a cut C.

For convenience of description, the left second storage electrode 133ba is cut. In addition, a portion between the connection bridge 83 and second bent part G3 is severed by a cut C. As such, the data signal (dotted line) is transmitted through the right second storage electrode 133bb.

If the right second storage electrode 133bb is cut, the data signal is transmitted through the left second storage electrode 133ba. If the connection part 33 is formed as shown in the exemplary embodiment, three portions are cut by the laser, which reduces the number of cuts, as compared to the related art.

In addition, in the exemplary embodiment of the present invention, the color filter 230 includes the recesses F, which expose the portion B that is short-circuited by the laser. When a laser us used for such cutting, particles may be generated that can short-circuit the common electrode and pixel electrode. Therefore, the recesses F increase the interval between the common electrode and pixel electrode, so it is possible to prevent such short-circuiting of the common electrode and pixel electrode.

Figure 8:
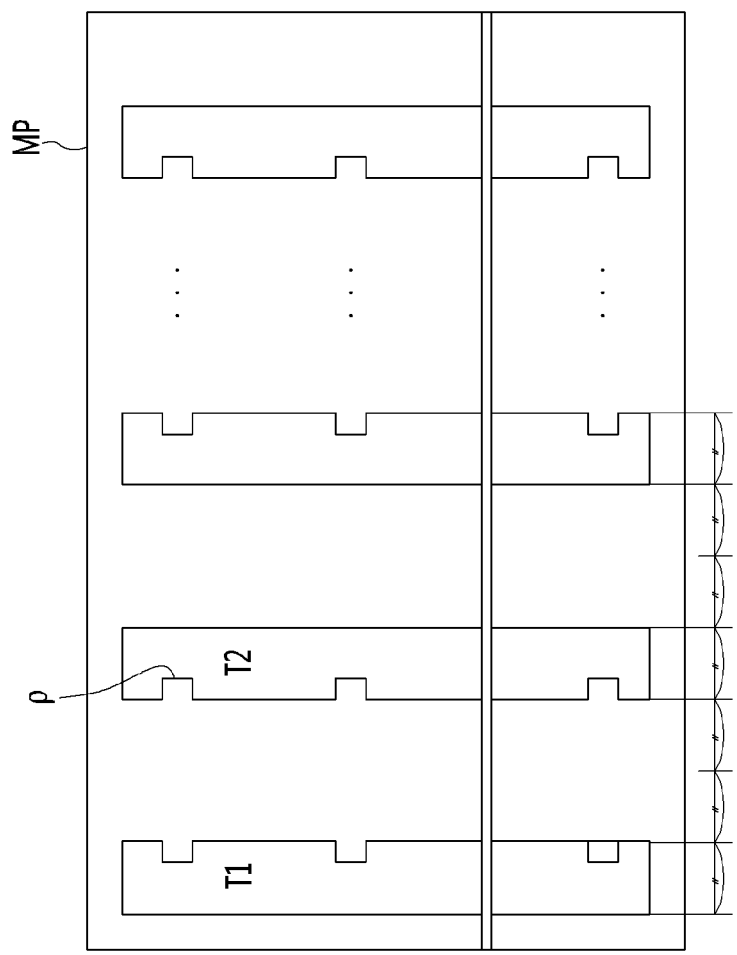
FIG. 8 and FIG. 10 are layout views that sequentially illustrate a method for forming a color filter, according to an exemplary embodiment of the present invention.
Figure 9:
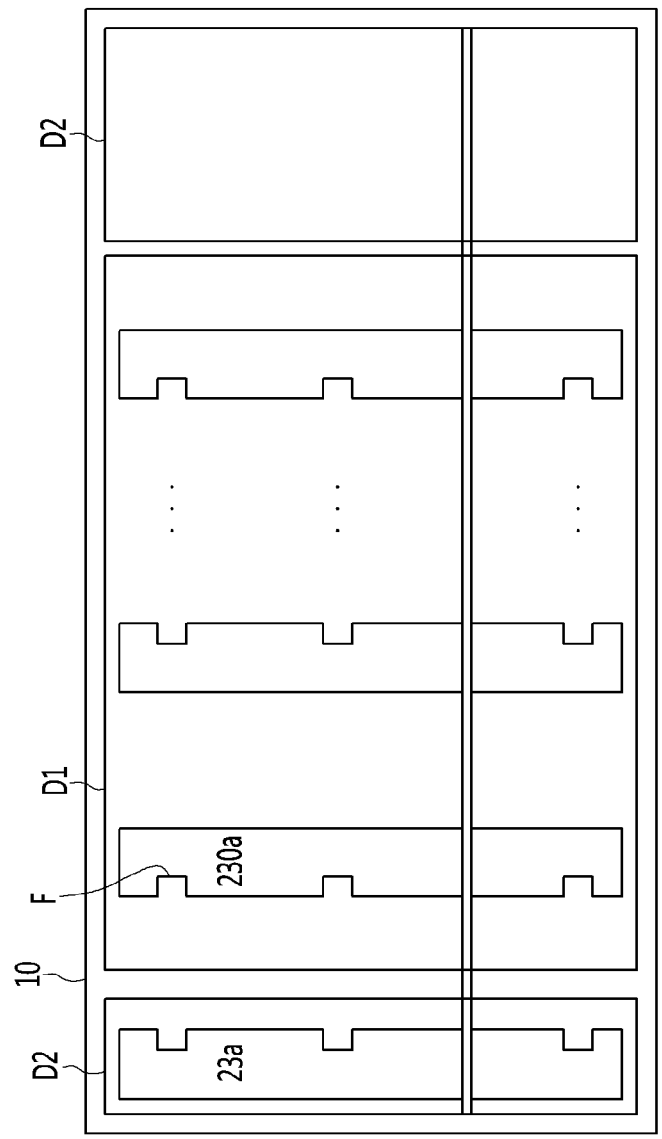
FIG. 9 is a top plan view of a photomask, according to an exemplary embodiment of the present invention.
Figure 10:
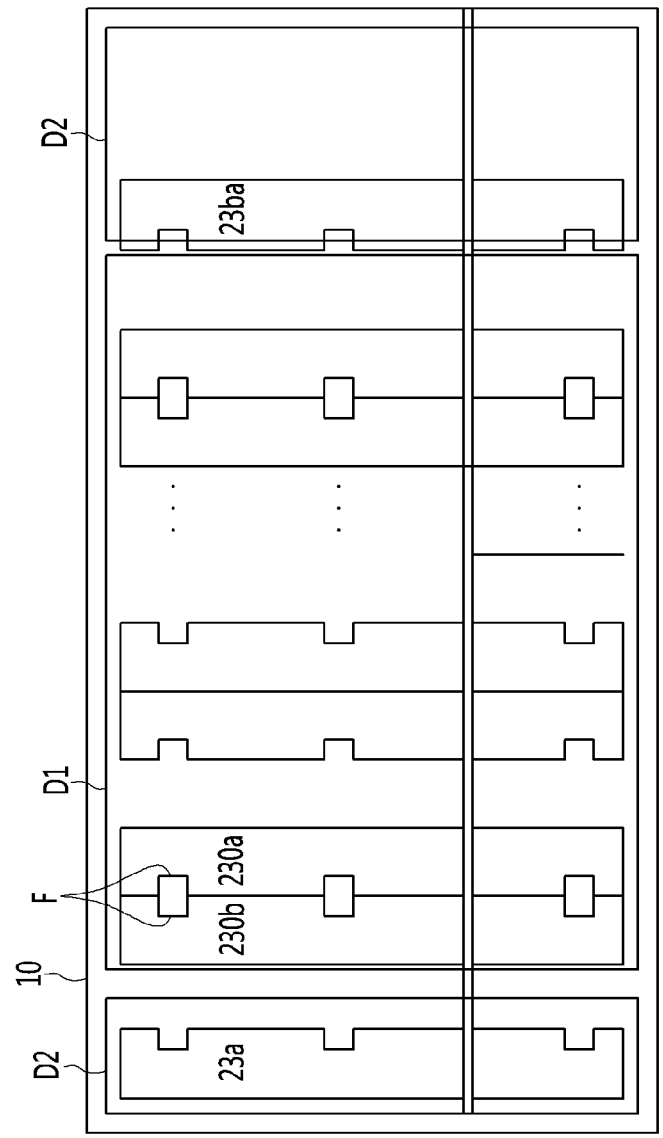

FIG. 8 and FIG. 10 are layout views that sequentially illustrate a method for forming a color filter, and FIG. 9 is a top plan view of a photo-mask, according to an exemplary embodiment of the present invention.

As shown in FIG. 8, a first color filter 230a is formed by coating a first photosensitive film (not shown) on the substrate 110, and exposing and developing the coating using a photomask. The first photosensitive film may include a green pigment, for example. A light blocking member is also formed on the substrate 110. A first dummy color filter 23a is formed in conjunction with the first color filter 230a, outside the display unit D1.

The photomask MP, as shown in FIG. 8, includes a first opening T1 and a second opening T2, which correspond to the pixel areas. The photomask MP includes projections P that extend into the openings T1 and T2. The projections P of the first opening T1 and the second opening T2 face away from each other and correspond to the recesses F. The first opening T1 and second opening T2 are separated from each other by a distance that is two times of the width of one of the openings T1 or T2, i.e., the width of one of the color filters 230a, 230b, of 230c.

As shown in FIG. 10, a second color filter 230b is formed by coating a second photosensitive film (not shown) on the substrate, and exposing and developing the second photosensitive film using the photomask MP. The second photosensitive film may include a red pigment, for example. As shown in FIG. 10, the photomask MP is moved horizontally, thus disposing the photomask MP so that the recesses F of the first color filter 230a and the recesses F of the second color filter 230b face each other.

Next, as shown in FIG. 4, a third color filter 230c is formed by coating a third photosensitive film (not shown) on the substrate 110, and exposing and developing the third photosensitive film using the photomask. The third photosensitive film may include a blue pigment, for example. In this case, the color filter 230 and dummy color filter 23, as shown in FIG. 4, are formed by horizontally moving the photomask, so that the recesses F of the second color filter 230b and the recess portion of the third color filter 230a face each other.

Figure 11:
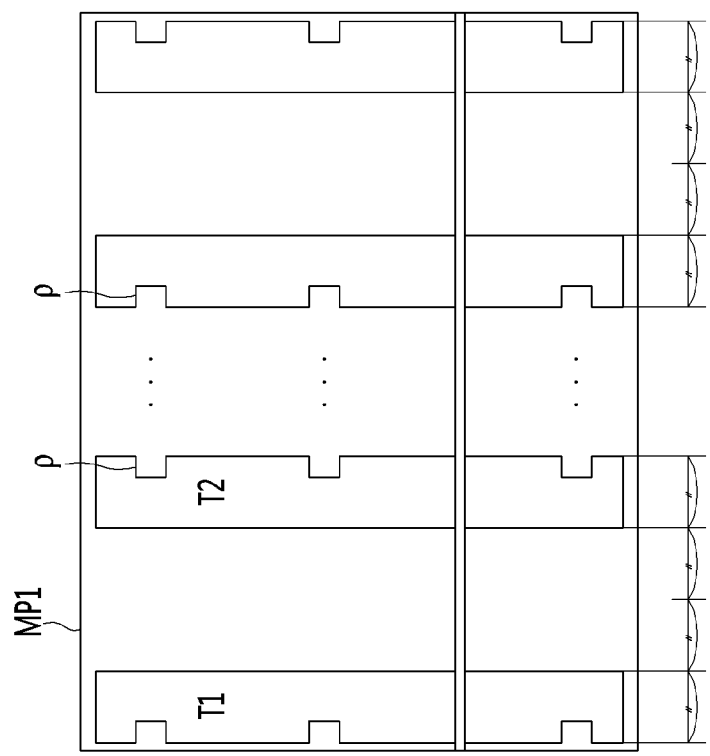
FIG. 11 is a top plan view of a photomask, according to an exemplary embodiment of the present invention.
Figure 12:
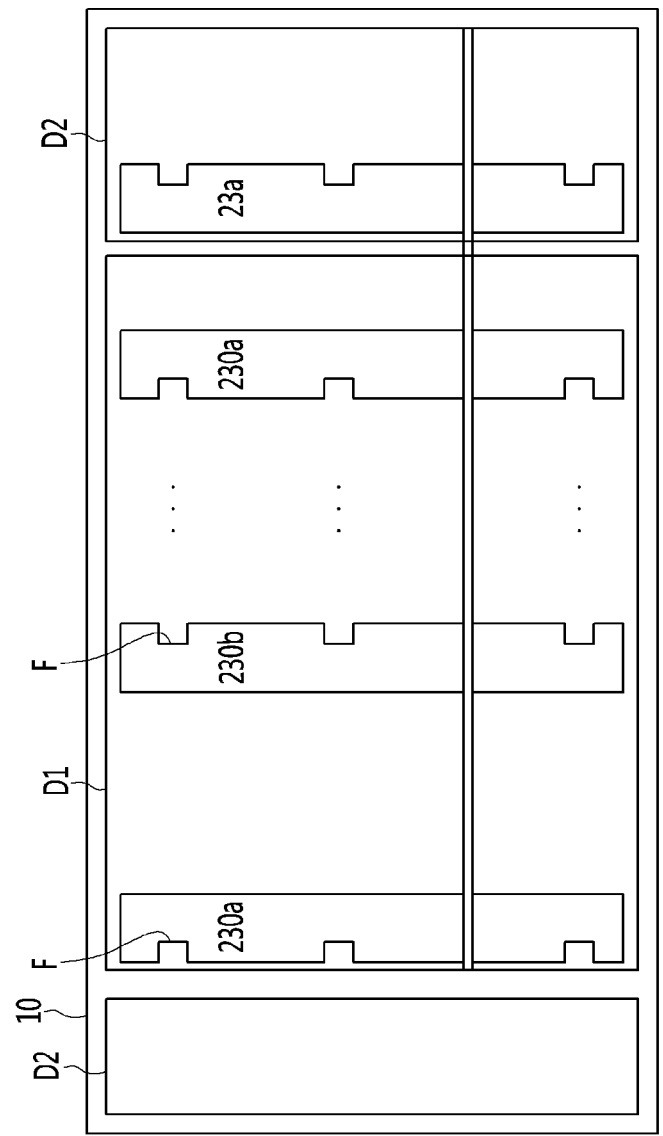
FIGS. 12, 13, 14 are layout views that sequentially illustrate a method for forming a color filter according to an exemplary embodiment of the present invention.
Figure 13:
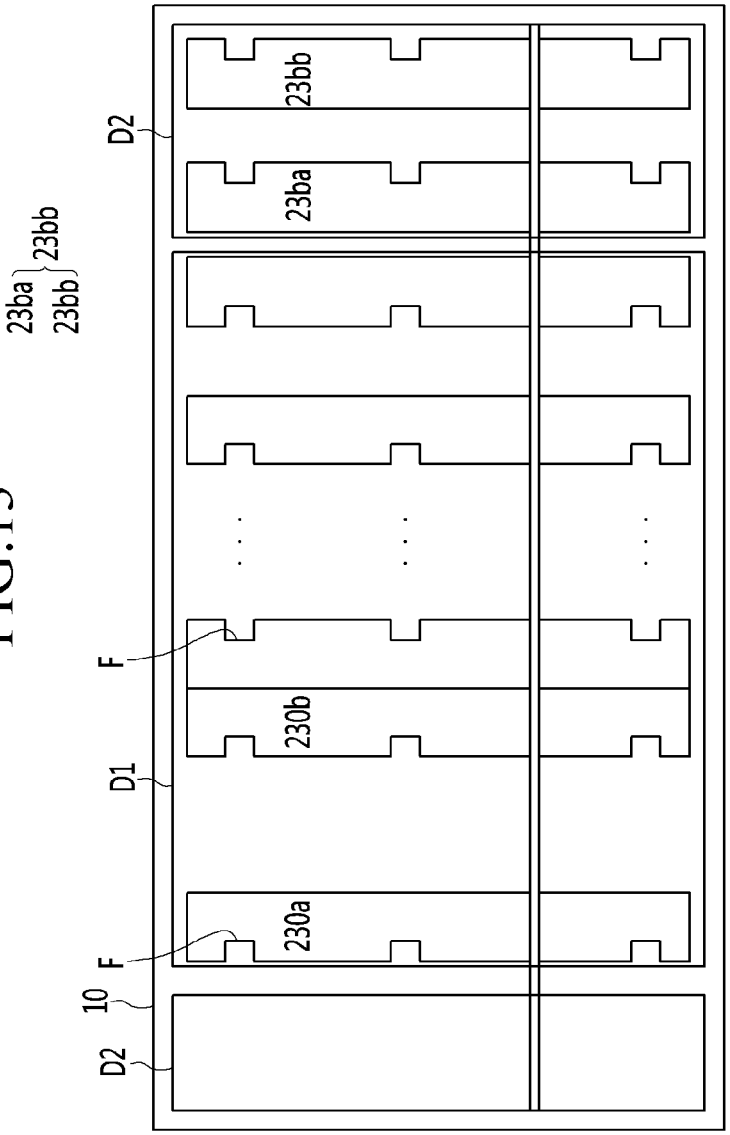
Figure 14:
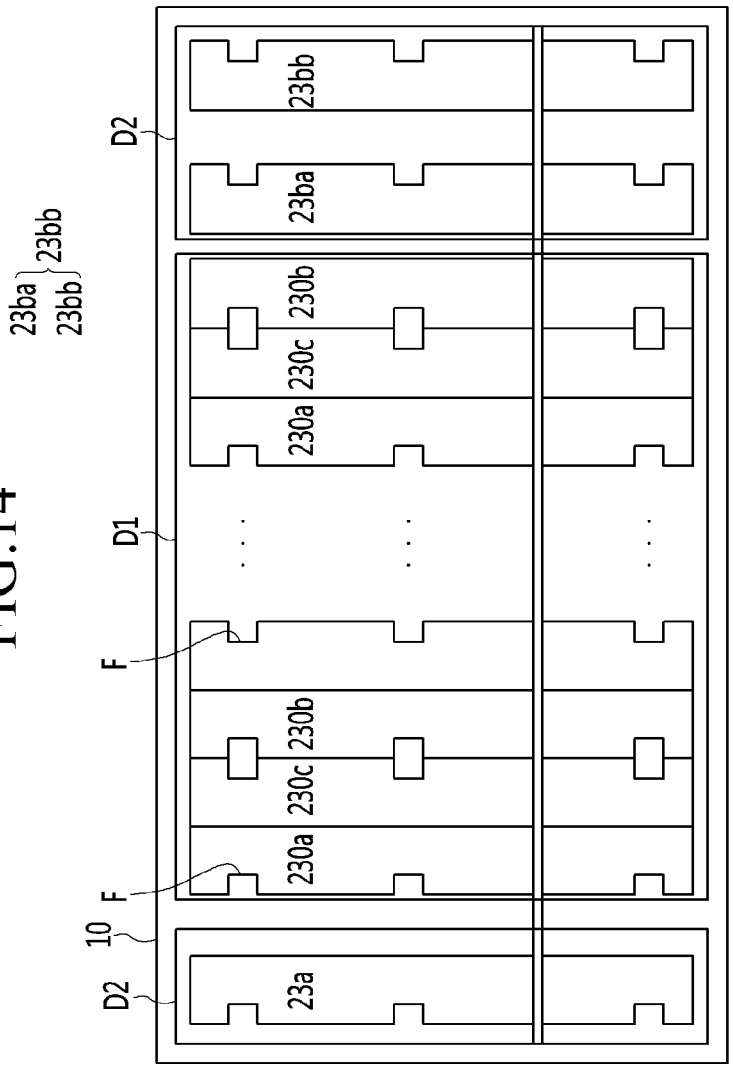

FIG. 11 is a top plan view of a photomask MP1, according to an exemplary embodiment of the present invention. FIG. 12 to FIG. 14 are layout views that sequentially illustrate a method for forming a color filter using the photomask MP1, according to an exemplary embodiment of the present invention. As shown in FIG. 12, a first color filter 230a is formed by coating a first photosensitive film (not shown) on a substrate 110, exposing and developing the film using the photomask MP1. In this case, the film may include a red pigment. A first small dummy color filter 23ba is also formed.

The photomask MP1, as shown in FIG. 11, includes a first opening T1 and a second opening T2 that include projections P. The projections P of the first opening T1 and the second opening T2 do not extend in the same direction. The first opening T1 and second opening T2 are separated from each other by a distance that is two times of the width of one of the openings T1 or T2.

As shown in FIG. 13, a second color filter 230b is formed by coating a second photosensitive film (not shown) and exposing and developing the film using the photomask MP1. The second photosensitive film includes a blue pigment, for example. The photomask MP1, as shown in FIG. 13, is moved horizontally, thus disposing the photomask MP1, so that the recesses F of the first color filter 230a and the recesses F of the second color filter 230b face in opposite directions. In this case, the second small dummy color filter 23bb is also formed.

As shown in FIG. 14, a third color filter 230c is formed by coating a third photosensitive film (not shown) on the substrate 110 and exposing and developing the film using the photomask MP1. The third photosensitive film includes a green pigment, for example. The photomask MP1 is moved horizontally, so that the recesses F of the second color filter 230b and the third color filter 230c face each other. In this case, the first dummy color filter 23a is also formed.

Figure 15:
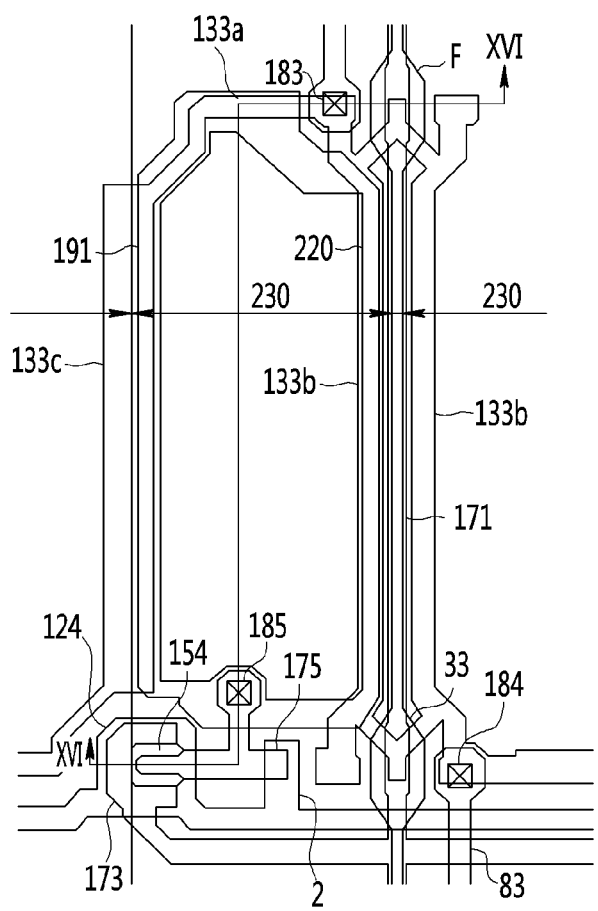
FIG. 15 is a layout view of a liquid crystal display according to another exemplary embodiment of the present invention.
Figure 16:
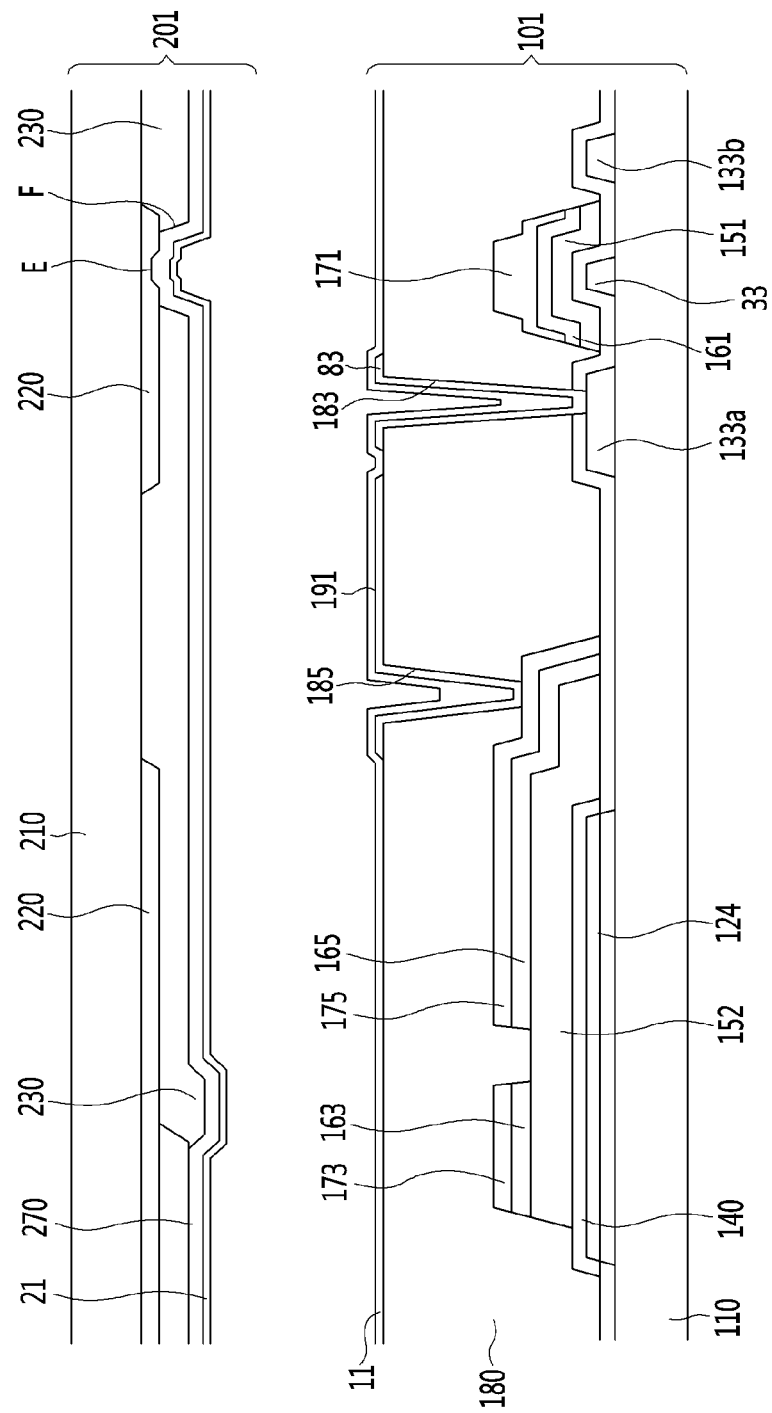
FIG. 16 is a cross-sectional view that is taken along the line II-II of FIG. 15.

FIG. 15 is a layout view of a liquid crystal display, according to another exemplary embodiment of the present invention, and FIG. 16 is a cross-sectional view that is taken along line XVI-XVI of FIG. 11. Since the interlayer structure of the liquid crystal display of FIG. 15 and FIG. 16 is mainly the same as the liquid crystal display of FIG. 1 and FIG. 2, only the differences there between will be described in detail.

Referring to FIG. 15 and FIG. 16, the liquid crystal display includes a thin film transistor array panel 101 and a common electrode panel 201 that face each other, and a liquid crystal layer (not shown) interposed there between. The thin film transistor array panel 101 includes a gate electrode 124, a gate line 121 that includes a protrusion 2 and a storage electrode formed on a transparent insulating substrate 110.

The storage electrode includes a first storage electrode 133a, a second storage electrode 133b, a third storage electrode 133c, and a pair of connection parts 33. A gate insulating layer 140 is formed on the gate conductor, and a semiconductor 151 is formed on the gate insulating layer 140. The semiconductor 151, unlike the semiconductor 154 of FIG. 1 and FIG. 2, is longitudinally formed along the data line 171, and includes a protrusion (not shown) that protrudes toward the gate electrode 124.

A pair of ohmic contacts 163 and 165 is disposed on the semiconductor strip 154. On the ohmic contacts 163 and 165 and gate insulating layer 140, a plurality of data lines 171 that include the source electrode 173, and a data conductor that includes a plurality of drain electrodes 175 are formed. The gate electrode 124, semiconductor 154, source electrode 173, and drain electrode 175 form a thin film transistor, and a channel of the thin film transistor is formed in the semiconductor 154, between the source electrode 173 and drain electrode 175.

According to various embodiments, the thin film transistor and the semiconductor 151 may be formed in the same process. As shown in FIGS. 1 and 2, an island-type semiconductor 154 that overlaps the gate electrode 124, drain electrode 175 and source electrode 173 may be formed. An ohmic contact 161 may be disposed between the semiconductor 151 and data line 171.

A passivation layer 180 that is made of the organic insulator is formed on the thin film transistor and includes a first contact hole 185, a second contact hole 183, and a third contact hole 184. A pixel electrode 191 and a connection bridge 83 are formed on the passivation layer 180. The pixel electrode 191 is connected to the drain electrode 175 through the first contact hole 185.

An alignment layer 11 is formed on the pixel electrode 191. The common electrode panel 201 includes a light blocking member 220 formed on a transparent insulating substrate 210. The light blocking member 220 prevents light leakage and corresponds to upper parts of the gate line 121, data line 171, thin film transistor, and storage electrodes 133a, 133b, and 133c.

The thickness of the light-blocking member 220 is reduced at an overlapping area E that faces the connection part 33 and data line 171. Since the thickness of the overlapping area E is thinner than the other portions of the light-blocking member 220, a cell gap of this portion is increased. Thus, short-circuiting of the common electrode and pixel electrode, caused by an impurity that is generated by the disconnection or short-circuiting is performed using the laser, can be reduced. In order to make the thicknesses of the light blocking members 220 different, it may be formed using a photomask that includes a slit pattern or semi-transparent film.

A color filter 230 is formed on the light blocking member 220. The color filter 230 includes a concave recess F that overlaps the area E of the light blocking member 220. Therefore, the cell gap of the overlapping area E may further increased, by the reduced thickness of the color filter 230. The color filter 230 may be formed using the same method as FIG. 4, and FIGS. 8 to 14.

A common electrode 270 is formed on the color filter 230, and an alignment layer 21 is formed on the common electrode 270. In the case when the data line 171 is disconnected, it may be repaired by using the method of FIG. 7.

Like in an exemplary embodiment of the present invention, it is possible to prevent short-circuit of the common electrode and pixel electrode, due to particles, by removing portions of the color filter 230 and increasing the interval between the common electrode 270 and pixel electrode 183, by reducing the thickness of the light blocking member 220 thin.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for repairing a thin film transistor array panel comprising:
   a substrate comprising pixel areas;
   gate lines extending along a first direction;
   data lines extending along a second direction;
   thin film transistors connected to the gate lines and the data lines;
   pixel electrodes disposed in the pixel areas and connected to the thin film transistors;
   storage electrodes extending along edges of the pixel electrodes, wherein the storage electrodes comprise first storage electrodes extending along the gate lines, second storage electrodes extending from the first storage electrodes and paired along both sides of the data line, and connection parts extending across the data lines and directly connecting pairs of second storage electrodes; and
   connection bridges extending across the gate lines and connecting the second storage electrodes of adjacent rows, when a first one of the data lines is disconnected between the second storage electrodes that are paired at a left side and a right side of a first data line,
   the method comprising:
   disconnecting the left side second storage electrode from the connection parts;
   disconnecting the right side second storage electrode from a corresponding connection bridge; and
   using a laser to fuse overlapping portions of the connection parts and the first data line, such that a voltage of the first data line is transmitted through the right side second storage electrode, around the disconnection in the first data line.

2. The method of claim 1, wherein the first storage electrodes are connected to the connection parts through the second storage electrodes.

3. The method of claim 2, wherein the first storage electrodes are not directly connected to the connection parts.

4. The method of claim 1, wherein the connection parts are not parallel with the gate lines.

5. The method of claim 1, wherein the connection parts are symmetrical with the data lines.

6. The method of claim 1, wherein a portion of the data line overlapping with the connection parts is wider than another portion of the data line not overlapping with the connection parts in width.

7. The method of claim 1, wherein the second storage electrodes each comprise a fixed end that is connected to one of the first storage electrodes and a free end that is not connected to one of the first storage electrodes.

8. The method of claim 7, wherein the second storage electrodes each comprise a first bent part connected to the fixed end, a second bent part connected to the free end, and a linear part that extends between the first bent part and the second bent part.

9. The method of claim 8, wherein the connection parts are generally Y-shaped or V-shaped.

10. The method of claim 9, wherein the second storage electrodes of each pair are bilaterally symmetrical with respect to the corresponding data line.

11. The method of claim 7, wherein the free end of the second storage electrodes is adjacent to thin film transistors.

12. The method of claim 11, wherein the free end of one second storage electrode of the pair of second storage electrodes is disposed in bottom-right of the corresponding pixel area, and the free end of another second storage electrode of the pair of second storage electrodes is disposed in top-left of the corresponding pixel area.

13. The method of claim 1, the connection bridges extend across two gate lines of the gate lines.

14. The method of claim 13, the connection bridges extend across source electrodes of the thin film transistors.

15. The method of claim 14, the source electrodes disposed between the two gate lines.

16. The method of claim 1, wherein the pixel electrode and thin film transistor of adjacent pixel areas in the same row are inversely symmetrical with respect to the corresponding data line.

* * * * *